United States Patent [19]
Yu

[11] Patent Number: 5,329,182
[45] Date of Patent: Jul. 12, 1994

[54] ATD PULSE GENERATOR CIRCUIT WITH ECL TO CMOS LEVEL CONVERSION

[75] Inventor: Ruey J. Yu, Austin, Tex.

[73] Assignee: Motorola Inc., Schaumburg, Ill.

[21] Appl. No.: 928,389

[22] Filed: Aug. 12, 1992

[51] Int. Cl.$^5$ .................. H03K 19/0175; G11C 8/00
[52] U.S. Cl. ..................... 307/475; 307/455; 365/233.5
[58] Field of Search ............... 307/475, 455; 365/189.11, 233.5

[56] References Cited

U.S. PATENT DOCUMENTS

| | | | |
|---|---|---|---|
| 4,678,941 | 7/1987 | Chao et al. | 307/449 |
| 4,897,820 | 1/1990 | Shiomi et al. | 365/189.11 |
| 4,943,741 | 7/1990 | Estrada et al. | 307/455 |
| 4,992,681 | 2/1991 | Urakawa et al. | 307/475 |
| 5,059,829 | 10/1991 | Flannagan et al. | 307/475 |
| 5,075,581 | 12/1991 | Kamata | 307/475 |
| 5,124,584 | 6/1992 | McClure | 365/233.5 |
| 5,140,191 | 8/1992 | Nogle et al. | 307/475 |
| 5,233,565 | 8/1993 | Wang | 365/233.5 |

Primary Examiner—Eugene R. LaRoche
Assistant Examiner—Son Dinh
Attorney, Agent, or Firm—Daniel D. Hill

[57] ABSTRACT

An ATD pulse generator circuit (20) provides an ATD pulse at CMOS logic levels in response to a single-ended ECL level input signal transition. An emitter-follower input portion (21), a differential amplifier (23), and emitter-follower portion (25) converts the single-ended input signal to intermediate level differential signals. P-channel transistors (51 and 52) receive the intermediate level differential signals and provide complementary CMOS level outputs signals. Cross-coupled delay portion (29) prevents the N-channel transistors (55 and 56) from switching on until after a delay, causing both of the CMOS level output signals to remain at logic high levels for a predetermined time. Cross-coupling the N-channel transistors (55 and 56) also results in reduced power consumption. A NAND gate (31) receives the logic high levels and provides a CMOS level ATD pulse, the duration of which is adjustable.

18 Claims, 2 Drawing Sheets

ATD PULSE GENERATOR CIRCUIT WITH ECL TO CMOS LEVEL CONVERSION

FIELD OF THE INVENTION

This invention relates generally to address transition detection (ATD), and more particularly, to a circuit for providing an ATD pulse.

BACKGROUND OF THE INVENTION

Integrated circuit memories, such as static random access memories (SRAMs) require increasingly short access times. SRAMs are often used in the portion of a processing system where speed is very important, such as in a cache. Address transition detection (ATD) is one method that has been used to decrease access times. ATD is generally used to provide data line precharge and equalization signals in an integrated circuit memory. However, ATD may also be used for other purposes, such as word line driving, bit line driving, data line sensing, and for data outputting. ATD decreases memory access times by preconditioning the above mentioned circuits, thus allowing a memory access to begin as soon as a change in the address is detected.

In a memory using ATD, an address transition detector provides a pulse in response to an address change. This pulse is used to perform the desired function in the memory, such as precharge and equalization. It is typical to have a separate address transition detector for each address signal for which transitions are to be detected. For example, if a transition of the row address is to be detected, then an address transition detector is commonly used for each row address signal. The output pulses of these detectors are then summed to provide a single pulse. This single pulse is provided when a change in any row address signal is detected.

The access time of a memory using ATD is related to the time it takes to generate an ATD pulse after an address change. The more rapidly an ATD pulse can be generated, the earlier a memory using ATD can be accessed, thus increasing the speed of the memory. However, increasing the speed of the memory usually results in increasing power consumption of the memory as well.

SUMMARY OF THE INVENTION

Accordingly, there is provided, in one form, a circuit for receiving an ECL level input signal and for providing a CMOS level output pulse. An input means receives the ECL level signal and provides first and second complementary signals of a predetermined logic level. Level converting means receives the first and second complementary signals and provides first and second CMOS level output signals. A first delay means receives the first CMOS level output signal and provides a first delayed signal after a predetermined delay. A second delay means receives the second CMOS level output signal and provides a second delayed signal after the predetermined delay. A first current source means receives the first CMOS level output signal and the second delayed signal and provides a current source for the level converting means. A second current source means receives the second CMOS level output signal and the first delayed signal and provides a current source for the level converting means. Logic means receives the first and second CMOS level output signals, and provides a CMOS level output pulse. These and other features and advantages will be more clearly understood from the following detailed description taken in conjunction with the accompanying drawings.

DESCRIPTION OF A PREFERRED EMBODIMENT

Figure 1:
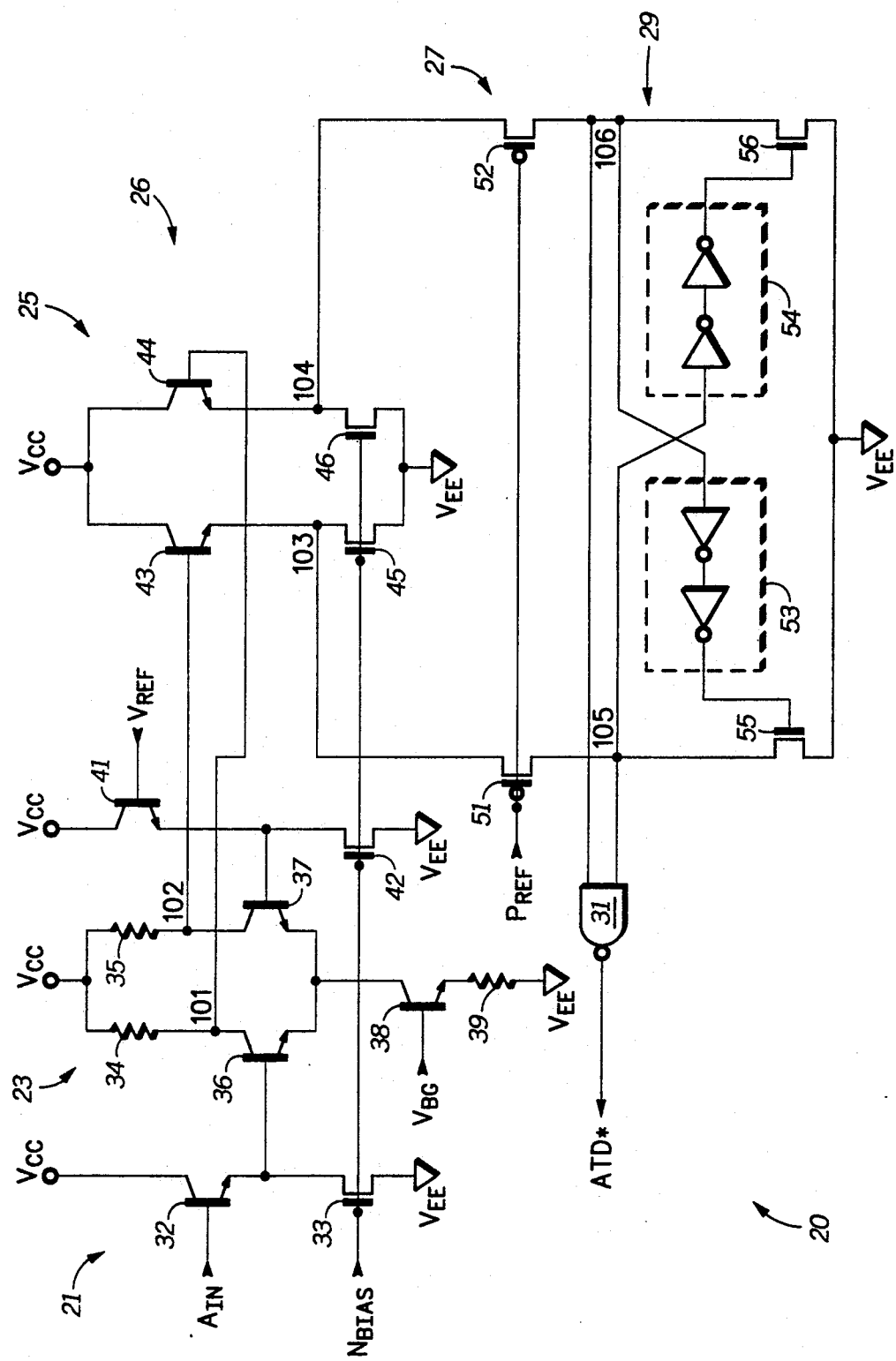
FIG. 1 illustrates in partial schematic diagram form and partial logic diagram form an ATD pulse generator circuit in accordance with the present invention.

FIG. 1 illustrates in partial schematic diagram form and partial logic diagram form ATD pulse generator circuit 20 in accordance with the present invention. ATD pulse generator circuit 20 includes emitter-follower input portion 21, differential amplifier 23, emitter-follower portion 25, level converter 27, cross-coupled delay portion 29, N-channel transistors 55 and 56, and NAND gate 31. Emitter-follower input portion 21, differential amplifier 23, and emitter-follower portion 25 comprise input portion 26. Emitter-follower input portion 21 includes NPN transistor 32 and N-channel transistor 33. Differential amplifier 23 includes resistors 34 and 35, NPN transistors 36, 37, and 38, and resistor 39. Emitter-follower portion 25 includes NPN transistors 43 and 44 and N-channel transistors 45 and 46. Level converter 27 includes P-channel transistors 51 and 52. Cross-coupled delay portion 29 includes delay portions 53 and 54.

NPN transistor 32 of emitter-follower input portion 21 has a collector connected to a positive power supply terminal labeled "$V_{CC}$", a base for receiving an input signal labeled "$A_{IN}$", and an emitter. Input signal $A_{IN}$ is a single-ended ECL level signal. N-channel transistor 33 has a drain connected to the emitter of transistor 32, a gate for receiving a bias voltage labeled "$N_{BIAS}$", and a source connected to a negative power supply voltage labeled "$V_{EE}$". Resistor 34 has a first terminal connected to $V_{CC}$, and a second terminal connected to node 101. Resistor 35 has a first terminal connected to $V_{CC}$, and a second terminal connected to node 102. NPN transistor 36 has a collector connected to the second terminal of resistor 34 at node 101, a base connected to the emitter of transistor 32, and an emitter. NPN transistor 37 has a collector connected to the second terminal of resistor 35 at node 102, a base, and an emitter connected to the emitter of NPN transistor 36. NPN transistor 38 has a collector connected to the emitters of NPN transistors 36 and 37, and a base for receiving a bias voltage labeled "$V_{BG}$", and an emitter. Resistor 39 has a first terminal connected to the emitter of NPN transistor 38, and a second terminal connected to $V_{EE}$. NPN transistor 41 has a collector connected to $V_{CC}$, a base for receiving a reference voltage labeled "$V_{REF}$", and an emitter connected to the base of NPN transistor 37. N-channel transistor 42 has a drain connected to the emitter of NPN transistor 41, a gate for receiving bias voltage $N_{BIAS}$, and a source connected to $V_{EE}$. NPN transistor 43 has a collector connected to $V_{CC}$, a base connected to the collector of NPN transistor 37 at node 102, and an emitter connected to node 103. NPN transistor 44 has a collector connected to $V_{CC}$, a base connected to the collector of NPN transistor 36 at node 101, and an emitter connected to node 104. N-channel transistor 45 has a drain connected to the emitter of transistor 43 at node 103, a gate for receiving bias voltage $N_{BIAS}$, and a source connected to $V_{EE}$. N-channel transistor 46 has a drain connected to the emitter of NPN transistor 44 at node 104, a gate for receiving bias voltage $N_{BIAS}$, and a source connected to $V_{EE}$.

P-channel transistor 51 of level converter 27 has a first current electrode connected to the emitter of NPN transistor 43 at node 103, a gate for receiving reference voltage $P_{REF}$, and a second current electrode connected to node 105. P-channel transistor 52 has a first current electrode connected to the emitter of NPN transistor 44, a gate for receiving reference voltage $P_{REF}$, and a second current electrode connected to node 106. Delay portion 53 has an input terminal connected to the second current electrode of P-channel transistor 52 at node 106, and an output terminal. Delay portion 54 has an input terminal connected to the second current electrode of P-channel transistor 51 at node 105, and an output terminal. N-channel transistor 55 has a drain connected to the second current electrode of P-channel transistor 51 at node 105, a gate connected to the output terminal of delay portion 53, and a source connected to $V_{EE}$. N-channel transistor 56 has a drain connected to the second current electrode of P-channel transistor 52 at node 106, a gate connected to the output terminal of delay portion 54, and a source connected to $V_{EE}$. NAND gate 31 has a first input terminal connected to the second current electrode of P-channel transistor 51 at node 105, a second input terminal connected to the second current electrode of P-channel transistor 52 at node 106, and an output terminal for providing an output pulse labeled "ATD*". In the preferred embodiment, output pulse ATD* is provided at CMOS logic levels and is active as a logic low. However, in other embodiments, output pulse ATD* can be provided as a logic high pulse, and/or can be provided at different logic levels, depending on the application. Note that an asterisk (*) after the signal name indicates that the signal is active at a logic low.

In operation, ECL level input signal $A_{IN}$ is received by ATD pulse generator circuit 20 at the base of NPN transistor 32. NPN transistor 32 and N-channel transistor 33 form emitter-follower input portion 21 to reduce the level of input signal $A_{IN}$ by one base-emitter diode voltage drop ($V_{BE}$). One $V_{BE}$ is equal to approximately 0.8 volts. N-channel transistor 33 receives bias voltage $N_{BIAS}$ and acts as a current source for NPN transistor 32. Reference voltage $V_{REF}$ is provided at the midpoint of the logic swing of input signal $A_{IN}$. NPN transistor 41 reduces reference voltage $V_{REF}$ by one $V_{BE}$. If the voltage at the base of NPN transistor 36 is more negative than $V_{REF}-V_{BE}$, which would be the case if input signal $A_{IN}$ were an ECL logic low, then NPN transistor 36 will be non-conductive and NPN transistor 37 will be conductive. A current designated as "$I_{38}$", through NPN transistor 38, will be steered through NPN transistor 37, and the voltage at node 102 will be equal to $V_{CC}$ minus $I_{38}R_{35}$ where $R_{35}$ is the resistance of resistor 35. The voltage at node 101 will be equal to approximately $V_{CC}$ since there is substantially no current flow through NPN transistor 36. If the voltage at the base of NPN transistor 36 is less negative than $V_{REF}-V_{BE}$, which would be the case if input signal $A_{IN}$ were an ECL logic high, then NPN transistor 36 will be conductive and NPN transistor 37 will be non-conductive. Current $I_{38}$ will be steered through NPN transistor 36 and the voltage at node 101 will be equal to $V_{CC}$ minus $I_{38}R_{34}$ where $R_{34}$ is the resistance of resistor 34, and the voltage at node 102 will be equal to approximately $V_{CC}$. Therefore, the difference between a logic high and a logic low voltage at nodes 101 and 102 is equal to the voltage drop across either of resistors 34 or 35. In the preferred embodiment, the voltage drop across resistor 34 and across resistor 35 is greater than or equal to about 1.5 volts.

In emitter-follower portion 25, NPN transistors are employed because of their higher drive capability to drive level converter 27, thus reducing time delay in input portion 21. NPN transistor 43 is connected as an emitter-follower transistor so that the voltage at node 103 is approximately equal to the voltage at node 102 minus one $V_{BE}$. NPN transistor 44 is also connected as an emitter-follower transistor so that the voltage at node 104 is approximately equal to the voltage at node 101 minus one $V_{BE}$. The voltages at nodes 103 and 104 are thus provided at predetermined intermediate, or analog, logic levels. The voltage at the midpoint of the intermediate logic swing is the common mode voltage for nodes 103 and 104. N-channel transistors 45 and 46 provide current sources for transistors 43 and 44, respectively to prevent nodes 103 and 104 from floating. In the preferred embodiment, N-channel transistors 45 and 46 are sized to provide a minimum amount of current in order to reduce the power consumption of ATD pulse generator circuit 20.

P-channel transistors 51 and 52 level convert the intermediate logic level voltage at nodes 103 and 104 to CMOS logic levels. A CMOS logic high voltage in ATD pulse generator circuit 20 is equal to approximately an intermediate logic high voltage. The CMOS logic low voltage is equal to approximately $V_{EE}$.

Reference voltage $P_{REF}$ is provided to P-channel transistors 51 and 52 at a voltage level approximately one $V_{TP}$ below the common mode voltage of nodes 103 and 104. $V_{TP}$ is the threshold voltage of a P-channel transistor. That is, if node 103 is at an intermediate logic high voltage of $V_{CC}-V_{BE}$ and node 104 is at an intermediate logic low voltage of $V_{CC}-I_{38}R_{34}-V_{BE}$, then reference voltage $P_{REF}$ is provided at one $V_{TP}$ below the common mode voltage of nodes 103 and 104, and is equal to approximately $V_{CC}-\frac{1}{2}(I_{38}R_{34})-V_{BE}-V_{TP}$.

A P-channel transistor becomes conductive when its gate-to-source voltage becomes more negative than the $V_{TP}$ of the transistor. P-channel transistor 51 becomes conductive when the intermediate logic level at node 103 increases to a logic high, thus causing the gate-to-source voltage ($V_{GS}$) of P-channel transistor 51 to become more negative than $V_{TP}$. For example, when node 103 becomes a logic high, node 104 becomes a logic low, and the $V_{GS}$ of P-channel transistor 52 becomes less negative than the $V_{TP}$ of P-channel transistor 52, making P-channel transistor 52 substantially non-conductive. The $V_{GS}$ of P-channel transistor 51 is more negative than $V_{TP}$, making P-channel transistor 51 conductive. When P-channel transistor 51 is conductive, the voltage at node 105 is increased to the voltage level at node 103, so that node 105 is a CMOS logic high voltage and node 106 is a CMOS logic low voltage.

ATD pulse generator circuit 20 provides output pulse ATD* each time input signal $A_{IN}$ changes logic states. For example, assume that input signal $A_{IN}$ is an ECL logic high. Therefore, node 103 is an intermediate logic high and node 104 is an intermediate logic low. Node 105 is a logic high and node 106 is a logic low. When input signal $A_{IN}$ changes to a logic low, node 104 becomes an intermediate logic high relatively quickly and node 103 becomes an intermediate logic low more slowly. This results in P-channel transistor 52 becoming conductive. Node 106 becomes a logic high relatively quickly, and remains at a logic high as long as node 104 is at an intermediate logic high. Node 105 remains high until pulled low by N-channel transistor 55. N-channel transistor 55 is delayed becoming conductive by delay portion 53. Node 105 remains at least one $V_{TP}$ above reference voltage $P_{REF}$, even after node 103 is reduced to an intermediate logic low by N-channel transistor 45. The reverse is true when $A_{IN}$ changes from a logic low to a logic high. Node 103 is pulled up to an intermediate logic high, causing node 105 to be pulled up to a logic high. Node 106 remains at a logic high as long as N-channel transistor 56 is inactive, (or non-conductive). N-channel transistor 56 is turned on (or conductive) after a delay provided by delay portion 54, reducing node 106 to near $V_{EE}$. Each time input signal $A_{IN}$ changes logic states, both of nodes 105 and 106 are at a CMOS logic high for a time period determined by cross-coupled delay portion 29. When both of nodes 105 and 106 are at logic high voltages, NAND gate 31 provides output pulse ATD* as a CMOS logic low at its output terminal.

In the preferred embodiment, N-channel transistors 55 and 56 are relatively weak compared to P-channel transistors 51 and 52. Also, the delay provided by delay portions 53 and 54 is provided by series coupled inverters. The length of the delay determines the duration of output pulse ATD*, where the length of the delay can be easily adjusted by increasing or decreasing the number of inverters in each of delay portions 53 and 54.

ATD pulse generator circuit 20 provides the advantages of high speed and lower power consumption. Because N-channel transistors 55 and 56 have their gates cross-coupled, as described above, N-channel transistor 56 will become non-conductive when P-channel transistor 52 is conductive And N-channel transistor 55 will be non-conductive when P-channel transistor 51 is conductive. This reduces the power consumption of ATD pulse generator circuit 20 by making N-transistors 55 and 56 non-conductive when their current source function is not necessary. The relatively small size of N-channel transistors 45, 46, 55, and 56 also benefits reduced power consumption, as well as contributing to the logic high overlap required to produce output pulse ATD*. In addition, making N-channel transistors 45, 46, 55, and 56 relatively small ensures that nodes 105 and 106 are pulled up rapidly, allowing output pulse ATD* to be generated as quickly as possible.

A problem with conventional ATD pulse generators is that a noise glitch may cause the ATD pulse to terminate too soon. An advantage of ATD pulse generator circuit 20 is that when a noise glitch occurs, both nodes 105 and 106 stay high, providing an output pulse ATD* for approximately the duration of the noise glitch.

Figure 2:
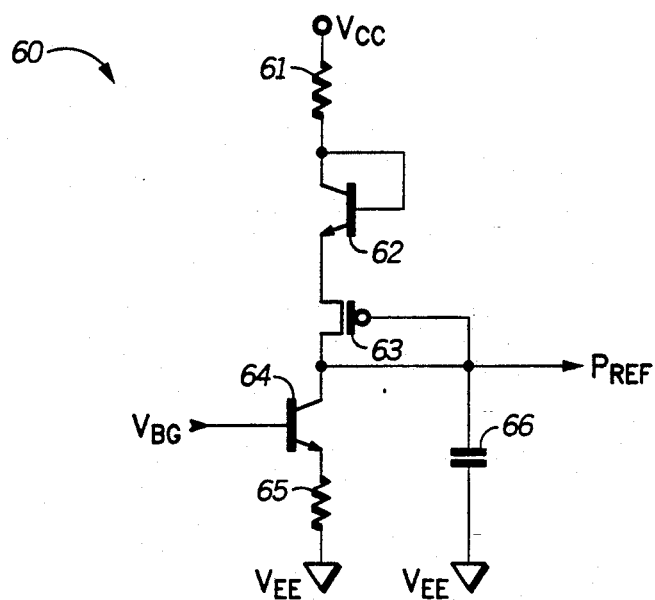
FIG. 2 illustrates in schematic diagram form a circuit for providing reference voltage $P_{REF}$ of FIG. 1 in accordance with the present invention.

FIG. 2 illustrates in schematic diagram form reference voltage circuit 60 in accordance with the present invention. Reference voltage circuit 60 includes resistors 61 and 65, NPN transistors 62 and 64, P-channel transistor 63, and capacitor 66. Resistor 61 has a first terminal connected to $V_{CC}$, and a second terminal. NPN transistor 62 has a collector and a base connected to the second terminal of resistor 61, and an emitter. P-channel transistor 63 has a source connected to the emitter of NPN transistor 62, a gate, and a drain for providing reference voltage $P_{REF}$. NPN transistor 64 has a collector connected to the drain of P-channel transistor 63, a base for receiving reference voltage $V_{BG}$, and an emitter. Resistor 65 has a first terminal connected to the emitter of NPN transistor 64, and a second terminal connected to $V_{EE}$. Capacitor 66 has a first terminal connected to the drain of P-channel transistor 63, and a second terminal connected to $V_{EE}$.

Reference voltage circuit 60 provides reference voltage $P_{REF}$ to the gates of transistors 51 and 52 of FIG. 1. The current through resistor 61 matches one-half of the voltage drop across resistors 34 or 35, depending on which of resistors 34 or 35 current $I_{38}$ is being steered through. Transistor 62 functions as a diode to drop the voltage at the second terminal of resistor 61 by one $V_{BE}$ to match the voltage drop across transistors 43 or 44. P-channel transistor 63 provides a voltage drop approximately equal to threshold voltage $V_{TP}$. Transistor 64 receives a bandgap generated bias voltage $V_{BG}$ to provide a constant current source for reference voltage circuit 60. Capacitor 66 acts to stabilize reference voltage $P_{REF}$.

Figure 3:
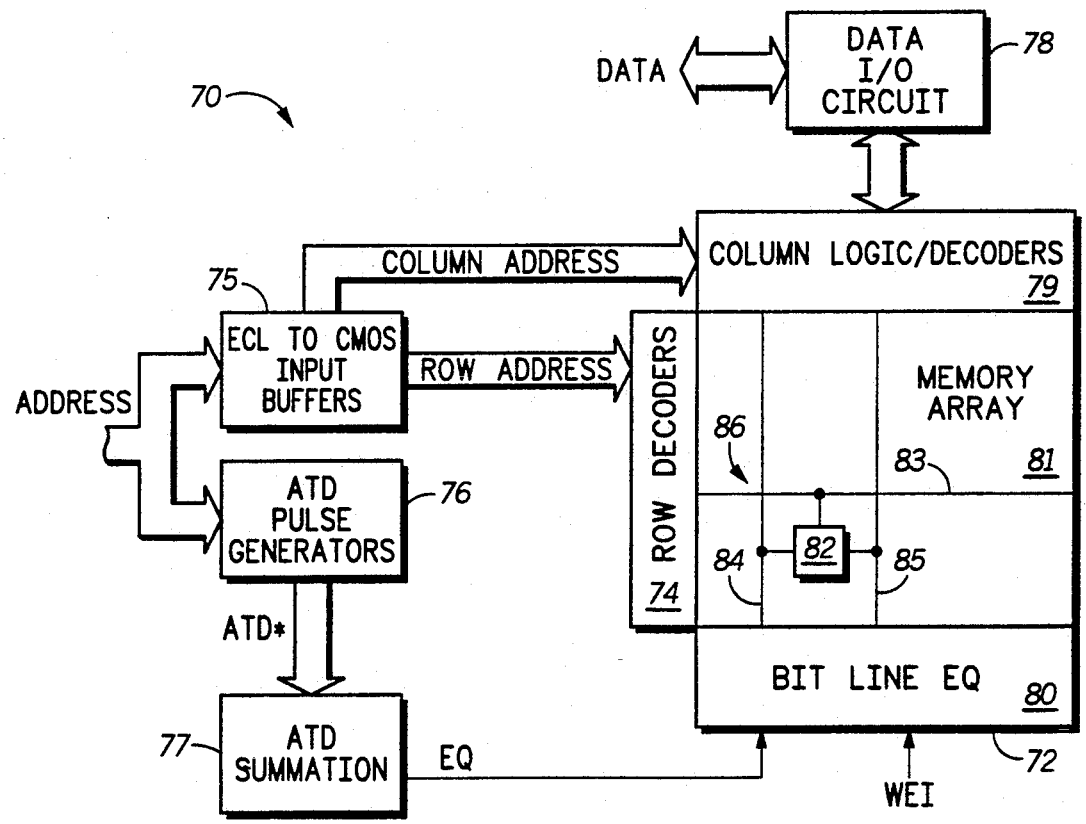
FIG. 3 illustrates in block diagram form a memory incorporating the ATD pulse generator circuit of FIG. 1 in accordance with the present invention.

FIG. 3 illustrates in block diagram form memory 70 incorporating ATD pulse generator circuit 20 in accordance with the present invention. Memory 70 includes memory block 72, row decoders 74, ECL to CMOS input buffer 75, ATD pulse generators 76, ATD summation 77, and data input/output circuit 78. Memory block 72 includes bit line equalization block 80, memory array 81, and column logic/decoder 79. Memory block 72 is a representative memory block of memory 70 and there may also be other memory blocks present in memory 70. Memory cells are located at intersections of word lines and bit line pairs. A representative memory cell 82 is illustrated in FIG. 3 connected to word line 83 and bit line pair 86. Bit line pair 86 includes bit lines 84 and 85.

ATD pulse generators 76 includes a plurality of ATD pulse generator circuits 20 of FIG. 1. There is one ATD pulse generator circuit 20 in ATD pulse generators 76 for each external address signal received by memory 70. ECL to CMOS input buffers 75 and ATD pulse generators 76 receives external address signals labeled "ADDRESS". ECL to CMOS input buffers 75 provides a row address labeled "ROW ADDRESS" and a column address labeled "COLUMN ADDRESS". ATD pulse generators 76 provides an ATD* pulse for each address change. ATD summation 77 receives the ATD* pulses and provides a bit line equalization signal labeled "EQ" to bit line equalization block 80. The particular address signals received by ATD pulse generators 76 have no special significance and may be different in other embodiments. Also, the amount of decoding performed by the row and column predecoders may be different in other embodiments.

Memory cells in memory array 81 are located at intersections of word lines and bit line pairs. Each memory cell is coupled to a word line and a bit line pair. Each bit line pair serves as an input to the memory cells during the write cycle of memory 70 and as an output during the read cycle. The logic state of internal write enable signal WEI determines whether memory 70 is in a read cycle or a write cycle. Bit line equalization block 80 receives equalization signal EQ from ATD summation 77, and is coupled to each bit line pair of memory array 81.

Column logic/decoder 79 is also coupled to each bit line pair. During a write cycle, data I/O circuit 78 receives a plurality of single-ended data signals labeled "DATA", and provides differential data signals to selected bit line pairs. During a read cycle, data input output circuit 78 receives differential data signals from selected bit line pairs and provides a plurality of single-ended data signals DATA. The number single-ended data signals provided to or received from memory 70 have no special significance and may be different in other embodiments.

Memory 70 functions as a conventional memory using address transition detection. To read data from memory 70, internal write enable signal WEI is inactive. External address ADDRESS is received by ECL to CMOS input buffer 75 to select a particular location in memory array 72. External address ADDRESS is also provided to ATD pulse generators 76. An address change is detected, and ATD summation 77 provides equalization signal EQ to precharge and equalize the bit line pairs to a predetermined voltage. A row address is provided to row decoder 74 to select a word line, of which word line 83 is an example. A column address COLUMN ADDRESS is provided to column logic/decoders 79 to select a bit line pair. Each memory cell that is coupled to the selected word line provides its output as a differential voltage on a corresponding bit line pair. Each time a new external address ADDRESS is received, bit line equalization pulse EQ is provided to equalize and precharge the bit lines.

For a word width of X1, column logic/decoder 79 selects one bit line pair, for example, bit line pair 86 which includes bit lines 84 and 85. When the bit line pair 86 is selected, column logic/decoder 79 then senses and amplifies the relatively small differential voltage provided to bit line pair 86 by memory cell 82, and couples bit line pair 86 to data input/output circuit 78. Data input/output circuit 78 receives a differential signal corresponding to the differential signal from bit line pair 86, and provides a single ended data signal.

During a write cycle, the flow of data is essentially reversed. To write data into memory 70, internal write enable signal WEI becomes active. Data input/output circuit 78 receives a data bit to be written into memory 70, and provides the data bit as a differential signal to memory array 81. An address is provided to select the memory cell that is to be written into. As in the read cycle, memory cells located on an enabled word line provide data to the bit line pairs. However, a voltage differential driven on the bit line pairs by column logic/decoder 79 is greater than the drive voltage of the memory cell and overwrites a stored bit in the memory cell. At the end of a write cycle the differential voltage on the bit line pair must be reduced to a level small enough so that the data is not erroneously written into a memory cell during the following read cycle. Equalization of the bit line pairs is achieved by bit line equalization block 80. Although address transition detection has been illustrated as providing equalization pulse EQ, it has other uses as well, such as for word line driving, bit line driving, data line sensing and data outputting.

As described above, according to the present invention, ATD pulse generator 20 receives input signal $A_{IN}$ and provides output pulse ATD* each time input signal $A_{IN}$ changes logic state. ATD pulse generator 20 performs a level conversion from an ECL logic level to a CMOS logic level. Cross-coupled delay portion 29 provides a delay when either of nodes 105 or 106 transitions from a logic high to a logic low, yet allows nodes 105 and 106 to transition from a logic low to a logic high relatively quickly. Each time input signal $A_{IN}$ changes logic state, both nodes 105 and 106 are a logic high for a predetermined time, providing output pulse ATD*. The duration of output pulse ATD* is determined by the length of the delay provided by cross-coupled delay portion 29. ATD pulse generator circuit 20 therefore provides CMOS level pulse ATD* at high speed and low power consumption with a minimum amount of circuitry.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A circuit for receiving an ECL level input signal and for providing a CMOS level output pulse, comprising:
  input means for receiving the ECL level signal, and in response, providing first and second complementary signals;
  a first MOS transistor having a first current electrode for receiving said first complementary signal, a control electrode for receiving a reference voltage, and a second current electrode for providing a first CMOS level output signal;
  a second MOS transistor having a first current electrode for receiving said second complementary signal, a control electrode for receiving said reference voltage, and a second current electrode for providing a second CMOS level output signal;
  first delay means having a first terminal coupled to said second current electrode of said first MOS transistor, and a second terminal;
  second delay means having a first terminal coupled to said second current electrode of said second MOS transistor, and a second terminal;
  first current source means, coupled to said second current electrode of said first MOS transistor and to said second terminal of said second delay means, for providing a current for said first MOS transistor a predetermined time after said second CMOS level output signal is received;
  second current source means, coupled to said second current electrode of said second MOS transistor and to said second terminal of said first delay means, for providing a current for said second MOS transistor said predetermined time after said first CMOS level output signal is received; and
  logic means for providing a CMOS level output pulse in response to receiving said first and second CMOS level output signals, a duration of said output pulse being determined by said predetermined time.

2. The circuit of claim 1, wherein said first and second MOS transistors are P-channel transistors.

3. The circuit of claim 2, wherein said reference voltage is provided at a P-channel threshold voltage ($V_{TP}$) below a common mode voltage of said first and second complementary signals.

4. The circuit of claim 1, wherein each of said first and second delay means each comprises a plurality of series connected inverters.

5. The circuit of claim 1, wherein said logic means comprises a two input NAND logic gate.

6. The circuit of claim 1, wherein said input means comprises:
- a first emitter-follower portion for receiving said ECL level signal and providing a level shifted signal;
- a differential amplifier for receiving said level shifted signal and a reference voltage and providing first and second differential signals; and
- a second emitter-follower portion for receiving said first and second differential signals, and in response providing said first and second complementary signals.

7. An address transition detection pulse generator circuit, comprising:
- input means for receiving an ECL level address signal, and in response, providing first and second complementary signals of a predetermined logic level;
- a first P-channel transistor having a first current electrode for receiving said first complementary signal, a gate for receiving a reference voltage, and a second current electrode for providing a first CMOS level output signal;
- a second P-channel transistor having a first current electrode for receiving said second complementary signal, a gate for receiving said reference voltage, and a second current electrode for providing a second CMOS level output signal;
- first delay means for receiving said first CMOS level output signal, and in response, providing a first delayed signal after a predetermined delay;
- second delay means for receiving said second CMOS level output signal, and in response, providing a second delayed signal after said predetermined delay;
- a first N-channel transistor having a drain connected to the second current electrode of said first P-channel transistor, a gate for receiving said second delayed signal, and a source coupled to a negative power supply voltage terminal;
- a second N-channel transistor having a drain connected to the second current electrode of said second P-channel transistor, a gate for receiving said first delayed signal, and a source coupled to said negative power supply voltage terminal; and
- logic means for receiving said first and second CMOS level output signals, and in response, providing a CMOS level address transition detection pulse.

8. The address transition detection pulse generator circuit of claim 7, wherein said input means comprises:
- a first emitter-follower portion for receiving said ECL level signal and providing a level shifted signal;
- a differential amplifier for receiving said level shifted signal and a reference voltage and providing first and second differential signals; and
- a second emitter-follower portion for receiving said first and second differential signals, and in response providing said first and second complementary signals.

9. The address transition detection pulse generator circuit of claim 7, wherein said first and second delay means each comprises a chain of series connected inverters.

10. The address transition detection pulse generator circuit of claim 7, wherein said logic means comprises a two input NAND logic gate.

11. The address transition detection pulse generator circuit of claim 7, wherein said reference voltage is provided at a P-channel threshold voltage ($V_{TP}$) below a common mode voltage of said first and second complementary signals.

12. The address transition detection pulse generator circuit of claim 11, further comprising:
- a first resistor having a first terminal coupled to a positive power supply voltage terminal and a second terminal;
- a first bipolar transistor having a collector and a base coupled to said second terminal of said first resistor;
- a third P-channel transistor having a first current electrode coupled to said emitter of said first bipolar transistor, a base coupled to a second current electrode of said third P-channel transistor, said second current electrode coupled to said gates of said first and second P-channel transistors, for providing said reference voltage;
- a second bipolar transistor having a collector coupled to said second current electrode of said third P-channel transistor, a gate for receiving a band gap generated reference voltage, and an emitter;
- a second resistor having a first terminal coupled to said emitter of said second bipolar transistor, and a second terminal coupled to said negative power supply voltage terminal; and
- a capacitor having a first terminal coupled to said second current electrode of said third P-channel transistor, and a second terminal coupled to said negative power supply voltage terminal.

13. An integrated circuit memory, comprising:
- an array of memory cells, each memory cell of the array of memory cells providing a pair of complementary data signals when selected;
- address means, coupled to said array of memory cells, for receiving an ECL level external address signal, and in response, selecting a memory cell;
- input means for receiving said ECL level external address signal, and in response, providing first and second complementary signals of a predetermined logic level;
- a first MOS transistor having a first current electrode for receiving said first complementary signal, a control electrode for receiving a reference voltage, and a second current electrode for providing a first CMOS level output signal;
- a second MOS transistor having a first current electrode for receiving said second complementary signal, a control electrode for receiving said reference voltage, and a second current electrode for providing a second CMOS level output signal;
- first delay means having a first terminal coupled to said second current electrode of said first MOS transistor, and a second terminal;
- second delay means having a first terminal coupled to said second current electrode of said second MOS transistor, and a second terminal;
- first current source means, coupled to said second current electrode of said first MOS transistor and to said second terminal of said second delay means, for providing a current for said first MOS transistor a predetermined time after said second CMOS level output signal is received;

second current source means, coupled to said second current electrode of said second MOS transistor and to said second terminal of said first delay means, for providing a current for said second MOS transistor said predetermined time after said first CMOS level output signal is received; and logic means for receiving said first and second CMOS level output signals, and in response, providing a CMOS level output pulse.

14. The integrated circuit memory of claim 13, wherein said input means further comprises:

a first emitter-follower portion for receiving said ECL level external address signal and providing a level shifted signal;

a differential amplifier for receiving said level shifted signal and a reference voltage and providing first and second differential signals; and a second emitter-follower portion for receiving said first and second differential signals, and in response providing said first and second complementary signals.

15. The integrated circuit memory of claim 13, wherein said first and second MOS transistors are P-channel transistors.

16. The integrated circuit memory of claim 15, wherein said reference voltage is provided at a P-channel threshold voltage ($V_{TP}$) below a common mode voltage of said first and second complementary signals.

17. The integrated circuit memory of claim 13, wherein each of said first and second delay means each comprises a plurality of series connected inverters.

18. The integrated circuit memory of claim 13, wherein said logic means further comprises a two input NAND logic gate.

* * * * *